US009437714B1

(12) United States Patent
Adusumilli et al.

(10) Patent No.: US 9,437,714 B1
(45) Date of Patent: Sep. 6, 2016

(54) SELECTIVE GATE CONTACT FILL METALLIZATION

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/963,523

(22) Filed: Dec. 9, 2015

(51) Int. Cl.
| | |
|---|---|
| *H01L 21/4763* | (2006.01) |
| *H01L 29/66* | (2006.01) |
| *H01L 21/28* | (2006.01) |
| *H01L 21/321* | (2006.01) |
| *H01L 21/285* | (2006.01) |

(52) U.S. Cl.
CPC ... *H01L 29/66795* (2013.01); *H01L 21/28088* (2013.01); *H01L 21/28562* (2013.01); *H01L 21/28568* (2013.01); *H01L 21/321* (2013.01); *H01L 29/66545* (2013.01)

(58) Field of Classification Search
CPC .................. H01L 21/28088; H01L 21/28562; H01L 21/28568; H01L 21/321
USPC ......................................................... 438/595
See application file for complete search history.

(56) References Cited

U.S. PATENT DOCUMENTS

| 8,436,404 | B2 | 5/2013 | Bohr | |
|---|---|---|---|---|
| 8,552,505 | B1 | 10/2013 | Kim | |
| 8,658,494 | B2 | 2/2014 | Frohberg | |
| 8,994,104 | B2 | 3/2015 | Glass | |
| 9,023,711 | B2 | 5/2015 | Marsh | |
| 9,040,369 | B2 | 5/2015 | Siddiqui | |
| 9,129,986 | B2 | 9/2015 | Zang | |
| 2007/0138559 | A1* | 6/2007 | Bohr | ................. H01L 21/28088 257/351 |
| 2012/0139062 | A1* | 6/2012 | Yuan | ................. H01L 21/76897 257/411 |
| 2014/0353734 | A1* | 12/2014 | Xie | ........................ H01L 21/283 257/288 |
| 2015/0021694 | A1 | 1/2015 | Trevino | |
| 2015/0162426 | A1 | 6/2015 | Majumdar | |

OTHER PUBLICATIONS

Adusumilli, Praneet et al., Metal Cap Protection Layer for Gate and Contact Metallization, U.S. Appl. No. 14/852,459, filed Sep. 11, 2015.

* cited by examiner

*Primary Examiner* — Trung Q Dang
(74) *Attorney, Agent, or Firm* — Daniel P. Morris, Esq.; Otterstedt, Ellenbogen & Kammer, LLP

(57) ABSTRACT

Gate metal is selectively deposited on work function material during formation of a replacement metal gate. The work function material is subjected to a hydrogen-based surface treatment to enable the subsequent selective deposition of the gate metal. Work function materials including titanium nitride and tantalum nitride may be processed to facilitate the selective deposition of gate metals, thereby simplifying the gate fabrication process by eliminating the need for subjecting the gate metal to a reactive ion etch or chemical mechanical planarization prior to formation of a dielectric cap.

16 Claims, 3 Drawing Sheets

SELECTIVE GATE CONTACT FILL METALLIZATION

The present disclosure relates generally to semiconductor devices, and more specifically, to a selective gate metal fill process and semiconductor devices obtained using such a process.

BACKGROUND

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Planar transistors, such as metal oxide semiconductor field effect transistors (MOSFETs) are particularly well suited for use in high-density integrated circuits. As the size of MOSFETs and other devices decreases, the dimensions of source/drain regions, channel regions, and gate electrodes of the devices, also decrease.

The use of metal gates within metal-oxide-semiconductor (MOS) transistors has developed with respect to both planar and three dimensional devices such as FinFET devices. Gate structures including a high-k dielectric layer and one or more metal layers that function as gate electrodes have been implemented. Replacement gate techniques, which are sometimes called "gate last" techniques, involve forming a "dummy" or sacrificial gate structure. The sacrificial gate structure remains present during various other fabrication processes, such as the formation of source/drain regions and possible annealing steps. The sacrificial gate structure is then removed to define a gate cavity where the desired actual gate structure is formed. Currently employed middle-of-line (MOL) metallization schemes that include the use of metal fill materials such as tungsten (W) on titanium nitride (TiN) liners.

In some replacement gate processes, disposable gate level layers are deposited on a semiconductor substrate as blanket layers, i.e., as unpatterned contiguous layers. The disposable gate level layers can include, for example, a vertical stack of a disposable gate dielectric layer, a disposable gate material layer, and a disposable gate cap dielectric layer. The disposable gate dielectric layer can be, for example, a layer of silicon oxide, silicon nitride, or silicon oxynitride. The thickness of the disposable gate dielectric layer can be from 1 nm to 10 nm, although lesser and greater thicknesses can also be employed. The disposable gate material layer includes a material that can be subsequently removed selective to the dielectric material of a planarization dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. Any other disposable gate level layers can also be employed provided that the material(s) in the disposable gate level layers can be removed selective to a planarization dielectric layer to be subsequently formed.

The disposable gate level layers are lithographically patterned to form disposable gate structures. Specifically, a photoresist is applied over the topmost surface of the disposable gate level layers and is lithographically patterned by lithographic exposure and development. The pattern in the photoresist is transferred into the disposable gate level layers by an etch process, which can be an anisotropic etch such as a reactive ion etch (RIE). The remaining portions of the disposable gate level layers (after the pattern transfer) form the disposable gate structures.

Disposable gate stacks may include, for example, first disposable gate structures formed over a first body region in a first device region (for example, an nFET region) and second disposable gate structures formed over a second body region in a second device region (for example, a pFET region). The first disposable gate structures can be a stack of a first disposable gate dielectric and gate material portions and first disposable gate cap portions, and the second disposable gate structures can be a stack of a second disposable gate dielectric and second disposable gate material portions and a second disposable gate cap portion. The first and second disposable gate cap portions are remaining portions of the disposable gate cap dielectric layer, the disposable gate material portions are remaining portions of the disposable gate material layer, and the disposable gate dielectric portions are remaining portions of the disposable gate dielectric layer. Gate spacers can be formed on sidewalls of each of the disposable gate structures, for example, by deposition of a conformal dielectric material layer and an anisotropic etch.

Source/drain extension regions are formed after the disposable gate structures have been completed. For example, selected dopants can be implanted into portions of the first body region that are not covered by the first disposable gate structures to form source/drain extension regions. Similarly, other selected dopants can be implanted into portions of the second body region that are not covered by the second disposable gate structures. Ion implantations can be employed to form source regions and drain regions for some devices. For example, dopants can be implanted into portions of the body regions that are not covered by the disposable gate structures and spacers.

A planarization dielectric layer is deposited over the semiconductor substrate, the disposable gate structures, and the gate spacers. The planarization dielectric layer may include a dielectric material that can be planarized, for example, by chemical mechanical planarization (CMP). For example, the planarization dielectric layer can include a doped silicate glass, an undoped silicate glass (silicon oxide), and/or porous or non-porous organosilicate glass. The planarization dielectric layer is planarized above the topmost surfaces of the disposable gate structures.

The disposable gate structures are removed by at least one etch. The at least one etch can be a recess etch, which can be an isotropic etch or anisotropic etch. The removal of the disposable gate structures can be performed employing an etch chemistry that is selective to the gate spacers and to the dielectric materials of the planarization dielectric layer. Cavities are formed from the spacers remaining after the disposable gate structures are removed. The semiconductor surfaces above the channel regions of the substrate can be physically exposed at the bottoms of the gate cavities, though native oxide layers may be present. The gate cavities are laterally enclosed by the gate spacers that were formed on the sidewalls of the disposable structures.

Replacement gate structures are formed in the gate cavities. Replacement gate structures are formed by replacement of the disposable structures and overlie channel regions of field effect transistors having permanent gate structures. A gate dielectric and a gate electrode are formed within each of the gate cavities. A gate dielectric layer can be deposited on the bottom surface and sidewall surfaces of each gate cavity and over the planarization dielectric layer. The gate dielectric layer can be deposited as a contiguous gate dielectric layer that contiguously covers all top surfaces of the planarization dielectric layer and all inner sidewall surfaces of the gate spacers. The gate dielectric layer can be a high dielectric constant (high-k) material layer having a dielectric constant greater than 3.9. Gate dielectric layers can include a dielectric metal oxide, which is a high-k material containing a metal and oxygen. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), and atomic layer deposition.

The replacement gate structures can include gate electrodes having different compositions in different regions of the substrate. For example, a first work function material layer can be deposited on the gate dielectric layers in one region and a second work function material can be deposited on the gate dielectric layers in a second region. A conductive material layer can be deposited on the work function material layers. The conductive material layer can include a conductive material deposited by physical vapor deposition, chemical vapor deposition, and/or electroplating. The conductive material layer can be an aluminum layer, a tungsten layer, an aluminum alloy layer, or a tungsten alloy layer. Tungsten can be deposited by chemical vapor deposition. Portions of the gate conductor layer, the work function material layers, and the gate dielectric layers are removed from the planarization dielectric layer by a planarization process. Replacement gate structures are thus formed, which include gate conductor layers, work function material layers, and gate dielectric layers.

Self-aligned contacts facilitate alignment during fabrication of integrated circuit devices having small dimensions. Such contacts have been formed by depositing metals such as aluminum and tungsten in trenches formed in dielectric materials while avoiding electrical contact with metal gate material. The recessing of gate fill metallization is followed by formation of a dielectric (e.g. nitride) cap. Self-aligned contacts are then formed while preventing gate to contact shorts.

SUMMARY

Principles of the present disclosure provide techniques for integrating metal gate materials using a simplified process flow.

In accordance with a first exemplary embodiment, a method is provided that includes obtaining a structure including a channel region comprising semiconductor material, spacers adjoining the channel region, a recess having an upper portion and a lower portion above the channel region and bounded by the spacers, a gate dielectric layer within the recess and adjoining the channel region, and a barrier layer on the gate dielectric layer. The barrier layer has an exposed inner surface comprising a work function material within the lower portion of the recess. The spacers have exposed inner surfaces adjoining the upper portion of the recess above the exposed inner surface of the barrier layer. The exposed inner surface of the barrier layer is selective to deposition of a gate metal with respect to the exposed inner surfaces of the spacers. The method further includes selectively depositing the gate metal on the exposed inner surface of the barrier layer, thereby forming a gate metal layer only within the lower portion of the recess and forming a dielectric cap within the upper portion of the recess.

An exemplary gate structure includes a channel region comprising semiconductor material, spacers adjoining the channel region, a recess having an upper portion and a lower portion above the channel region and bounded by the spacers, a gate dielectric layer within the recess and adjoining the channel region, and a barrier layer on the gate dielectric layer. The barrier layer has an inner surface comprising a work function material within the lower portion of the recess. The spacers have inner surfaces adjoining the upper portion of the recess above the inner surface of the barrier layer. The inner surface of the barrier layer is selective to deposition of a gate metal with respect to the inner surfaces of the spacers. The gate structure further includes gate metal within the recess and directly contacting the inner surface of the barrier layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed.

Substantial beneficial technical effects are provided. For example, one or more embodiments may provide one or more of the following advantages:

Simplifying gate fabrication process;
Facilitating use of gate metals that are not amenable to recessing;
Facilitating use of gate metals requiring thinner barrier layers than tungsten;
Reducing variability in gate resistance;
Reducing voids during metallization.

These and other features and advantages of the present invention will become apparent from the following detailed description of illustrative embodiments thereof, which is to be read in connection with the accompanying drawings.

BRIEF DESCRIPTION OF THE DRAWINGS

The following detailed description, given by way of example, will best be appreciated in conjunction with the accompanying drawings, in which.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
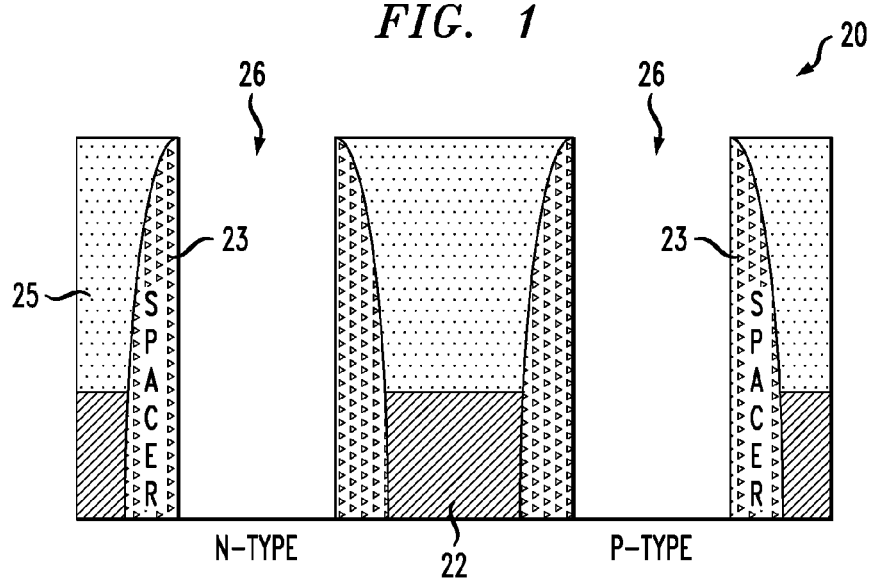
FIG. 1 is a schematic, cross-sectional view showing a step in the fabrication of a replacement gate following removal of a dummy gate.

FIG. 1 schematically illustrates a partially completed semiconductor structure 20 that can be formed using replacement gate technology substantially as described above. The semiconductor structure includes electrically isolated n-type and p-type regions. While shown as a structure including a substrate having semiconductor fins 22 as used in the fabrication of FinFET devices, the techniques described herein are also applicable to planar structures. The n-type region(s) are used for forming nFET devices and the p-type regions are for forming pFET devices. Dielectric and polysilicon layers may be deposited on the finned substrate and patterned to form a dummy gate (not shown) in accordance with standard polysilicon gate CMOS process flows. Gate sidewall structures or spacers 23 are formed on the dummy gate. A silicon nitride ($Si_3N_4$) layer can be deposited via CVD, PECVD, sputtering, or other suitable technique, forming the spacers 23. The spacers can include a single layer or be multi-layer. Spacer thickness is between two and ten nanometers (2-10 nm) in some embodiments. Spacers can be formed by any method known in the art, including depositing a conformal nitride layer over the dummy gate structures and removing unwanted material using an anisotropic etching process such as reactive ion etching or plasma etching. The dummy gate structures (not shown) and associated spacers 23 protect the underlying portions of the semiconductor fins 22 that later function as channel regions of FinFET devices. Fin regions outside the dummy gate structures and spacers 23 later function as source/drain regions. Expanded source/drain structures (not shown) can be grown epitaxially on the exposed source/drain portions of the semiconductor fins 22. Either p-type devices or n-type devices can be fabricated depending on the conductivity types of the epitaxial source/drain structures, as known in the art. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminium, gallium and indium. As used herein, "n-type" refers to the addition of impurities that contributes free electrons to an intrinsic semiconductor. In a silicon-containing substrate, examples of n-type dopants, i.e., impurities, include but are not limited to antimony, arsenic and phosphorous. In embodiments where n-type FinFET devices are to be formed, in-situ n-doped silicon may be used to form the epitaxial source/drain structures. In-situ doping of the source/drain structures can be conducted using conventional precursor materials and techniques. Source/drain epitaxy to form p-doped source/drain regions may include the introduction of boron precursor gas such as diborane. The p-doped source/drain structures may consist essentially of boron-doped silicon germanium in one or more exemplary embodiments. Exemplary epitaxial growth processes that are suitable for use in forming the silicon and silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 550° C. to 900° C. If the replacement gate technique is employed in conjunction with the formation of planar devices, conventional implantation of the substrate may be employed to form source/drain regions. Once the source/drain regions have been formed and other possible processing steps completed, an electrically insulating layer 25 is deposited on the structure and about the dummy gate. The layer 25 is planarized to expose the polysilicon layer of the dummy gate. The dummy gate can be removed by reactive ion etching (ME) and/or wet chemical etching to form a recess 26 bounded by the spacers 23, thereby obtaining a structure 20 as schematically illustrated in FIG. 1.

Figure 2:
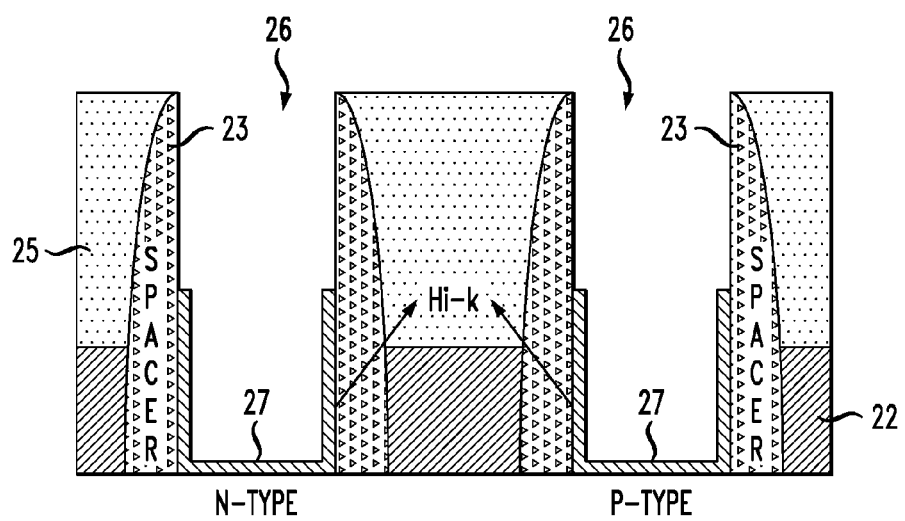
FIG. 2 is a schematic, cross-sectional view thereof following deposition of a gate dielectric layer.

As shown in FIG. 2, the recess 26 is filled in part with a gate dielectric layer 27. A high-k gate dielectric layer is conformally deposited in the recess 26 following dummy gate removal. The thickness of the gate dielectric material can vary depending on the required device performance. Chemical vapor deposition or atomic layer deposition (ALD) can be employed for depositing a high-k dielectric material such as hafnium oxide. Other exemplary high-k dielectric materials include but are not limited to $ZrO_2$, $La_2O_3$, $Al_2O_3$, $TiO_2$, $SrTiO_3$, $LaAlO_3$, $Y_2O_3$, $HFO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$. The gate dielectric layer used in some devices may alternatively include a multi-layer of $SiO_2$, SiON, SiN, and a high-k dielectric material, including but not limited to hafnium oxide ($HfO_2$), aluminium oxide ($Al_2O_3$), lanthanum oxide ($La_2O_3$), zirconium oxide ($ZrO_2$), and their respective silicates. The thickness of the gate dielectric may be in the range of 1.0 nm-5.0 nm in some exemplary embodiments. Post-deposition annealing (PDA) is conducted in accordance with conventional processing procedures. An etch-back process is employed to remove the gate dielectric material from the upper portions of the recesses 26. Plasma etching is among the techniques known for etching high-k dielectric materials such as hafnium oxide. Selected portions of the gate dielectric material in the lower portions of the recesses 26 can be protected by a mask (not shown) during the etch-back process. The etch-back of conformally deposited gate dielectric materials is known in the art.

Figure 3:
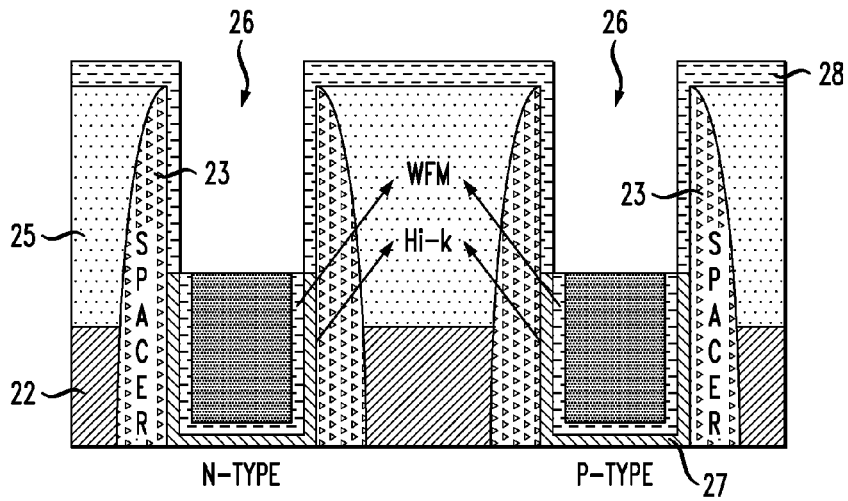
FIG. 3 is a schematic, cross-sectional view thereof following deposition of a work function material.

A titanium nitride (TiN) liner/barrier film layer 28 is conformally deposited on the gate dielectric layer using, for example, an ALD process. The barrier film layer may have a thickness of about 40 Å of titanium nitride (TiN) in embodiments wherein tungsten metallization is later employed. Barrier film layer thickness of 15-20 Å of TiN is typically sufficient for cobalt metallization. Tantalum nitride (Ta(N)) may alternatively be employed to form the barrier film layer 28. The barrier film layer may comprise multiple layers in some embodiments, including a work function material adjoining the recess 26. In some embodiments, the barrier film layer 28 is deposited subsequent to etch-back of the gate dielectric layer to obtain a structure as schematically illustrated in FIG. 3. Alternatively, the barrier film layer can be deposited prior to etch-back of the gate dielectric layer 27.

Figure 4:
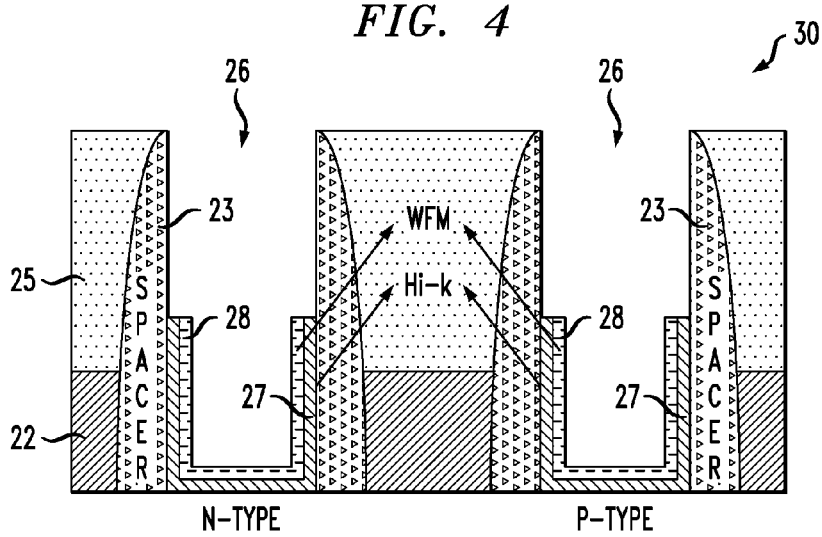
FIG. 4 is a schematic, cross-sectional view thereof following recessing of the work function material.

Referring to FIG. 4, an organic planarization layer (OPL) (not shown) is deposited and then patterned to protect the barrier film layer in the lower portions of the recesses 26. The work function metal (for example, titanium nitride) above the level of the OPL is etched away and removed. The remaining OPL is then removed from the structure by ashing. The resulting structure 30 accordingly includes dielectric and barrier layers 27, 28 at the bottom portions of the recesses 26 while the inner surfaces of the spacers 23 are exposed at the top portions of the recesses 26. In embodiments where the barrier film layer 28 is deposited prior to etch-back of the gate dielectric layer, both layers 27, 28 are etched back at this stage to obtain the structure 30 schematically illustrated in FIG. 4.

Hydrogen-based processes may be employed to prepare/engineer an exposed metal surface such that subsequent metal deposition takes place selectively on exposed metal surfaces as opposed to non-metal surfaces such as the surfaces of dielectric materials. Nucleation selectively takes place on an exposed electrically conductive surface during the deposition of gate metal. Hydrogen-based surface treatment of the structure 30 includes exposing the structure to hydrogen under certain pressure (0.5-10 torr), temperature (200-400° C.) and flow rate (1-12 standard liters per minute (slm)). The surface material (e.g. Ti(N), Ta(N)) lining the bottom portion of the recesses 26 thereby becomes amenable to the deposition of electrically conductive metals that can function as gate electrodes while the nitride surfaces in the upper portions of the recesses 26 and the oxide surface at the top of the structure 30 are not so amenable.

Figure 5:
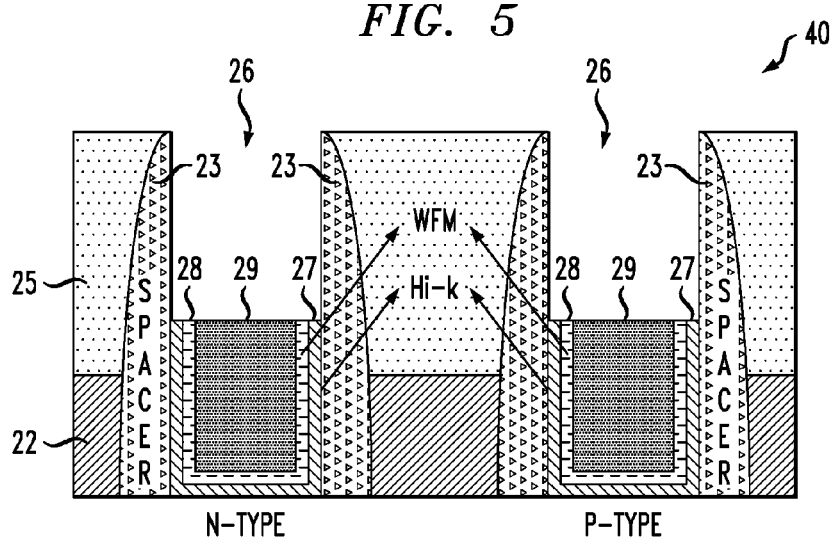
FIG. 5 is a schematic, cross-sectional view thereof following deposition of a metal gate material.

Metal gate material 29 is selectively deposited on the treated surface of the barrier layer 28. The gate metal layer can be from about three nanometers (3 nm) to five hundred nanometers (500 nm) in thickness in exemplary embodiments, though lesser and greater thicknesses may also be employed. Chemical vapor deposition (CVD) may be employed for the selective deposition of metals such as tungsten, cobalt, ruthenium, rhodium, osmium, iridium and/or molybdenum. Cobalt can be deposited using techniques such as chemical vapor deposition may be able to significantly reduce seams and voids in MOL structures, such as those shown in FIGS. 4-5. Cobalt has an electrical conductivity similar to that of tungsten. However, cobalt does not require relatively thick liners that would contribute to high resistance. For example, while 40 Å of titanium nitride (TiN) is typically necessary for tungsten metallization, 15-20 Å of TiN is typically sufficient for cobalt metallization. The gate electrode may be deposited as multiple layers in some embodiments. The employment of a process enabling selective deposition of gate metal enables the fabrication of the structure 40 schematically illustrated in FIG. 5 without the need for removing excess metal (metal overburden) on the structure via chemical mechanical planarization (CMP) and forming recesses within the spacers 23 via reactive ion etch (ME), as employed in some conventional processes. Gate metal deposition is timed so that the gate electrodes are confined to the lower portions of the recesses 26, leaving the upper portions of the recesses 26 unfilled. In other words, the structure 40 as fabricated using selective metal deposition on a treated work function material liner includes gate metal 29 within the bottom portion of the recess 26 while the top portion of the recess 26 remains open. Recessing and CMP of the deposited gate metal 29 are not required as a sufficient volume remains above the gate metal in which to deposit cap material. In addition to simplifying the fabrication process by eliminating certain steps, the selective deposition process allows greater selection in the choice of gate metals. For example, while metals like tungsten are amenable to ME-based recessing, metals such as cobalt are not due to extremely low vapor pressure of cobalt-based halides. By avoiding RIE following metal deposition, the variability in gate metal resistance introduced by such processing is also avoided. Processing time and cost can also be reduced. The avoidance of CMP following gate metal deposition provides further benefits as there will be no "dishing" of the deposited metal (e.g. tungsten) nor will the thickness of the electrically insulating layer 25 be reduced. Dishing of metal surfaces and insulating layer (e.g. oxide) loss due to CMP influence manufacturing yield and can lead to surface irregularities. A substantially void free metal fill and minimal variability in gate resistivity are provided in one or more embodiments.

Figure 6:
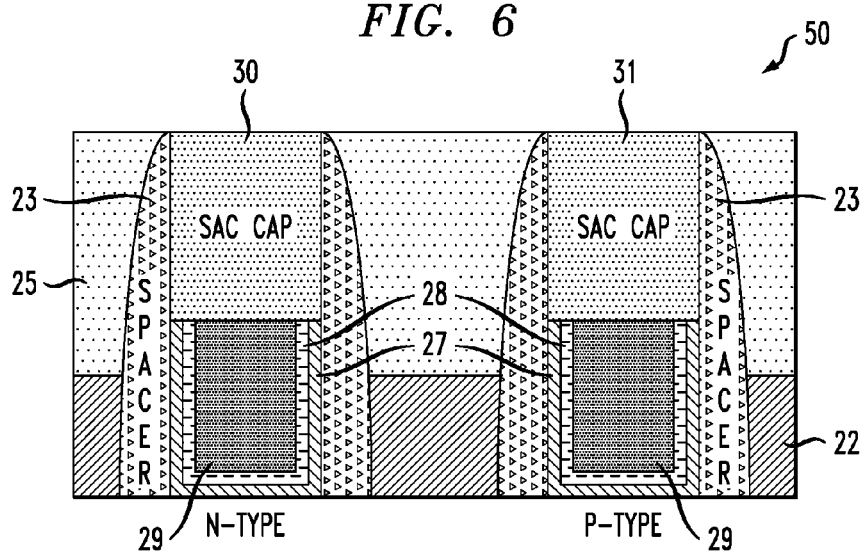
FIG. 6 is a schematic, cross-sectional view thereof following deposition of a dielectric cap on the metal gate material.

The portions of the recesses 26 above the deposited gate metal 29 are filled with a dielectric material to form dielectric caps 31 on the metal cap layers to protect the gate during self-aligned contact etch. The gate metal 29 is not subjected to RIE prior to formation of the caps 31 thereon as sufficient volumes remain between the spacers to accommodate the caps. The caps may be formed from materials such as silicon nitride to facilitate a self-aligned contact (SAC) process, ensuring requisite selectivity for the SAC etch. After deposition, the dielectric cap material is planarized to remove it from the surface of the dielectric layer 25. The dielectric cap material remains within the recess 26 following planarization, thus completing the structure 50 shown in FIG. 6. The dielectric caps 31 prevent shorting between the metal gates 29 and subsequently formed self-aligned contacts (not shown).

Given the discussion thus far, an exemplary method includes obtaining a obtaining a structure 30 including a channel region comprising semiconductor material, spacers 23 adjoining the channel region, a recess 26 having an upper portion and a lower portion above the channel region and bounded by the spacers 23, a gate dielectric layer 27 within the recess and adjoining the channel region, and a barrier layer 28 on the gate dielectric layer. The barrier layer has an exposed inner surface comprising a work function material within the lower portion of the recess. The spacers 23 have exposed inner surfaces adjoining the upper portion of the recess above the exposed inner surface of the barrier layer. The exposed inner surface of the barrier layer is selective to deposition of a gate metal 29 with respect to the exposed inner surfaces of the spacers 23. The method further includes selectively depositing the gate metal on the exposed inner surface of the barrier layer, thereby forming a gate metal layer only within the lower portion of the recess and forming a dielectric cap 31 within the upper portion of the recess. The forming of the dielectric cap within the upper portion of the recess is performed without prior chemical mechanical planarization of the gate metal in one or more embodiments, thereby avoiding problems such as CMP dishing that characterize methods requiring CMP.

The structure 30 is obtained in one or more embodiments by forming a sacrificial gate on the channel region, forming the spacers on the sacrificial gate, removing the sacrificial gate, thereby forming the recess bounded by the spacer, forming the gate dielectric layer on the channel region and within the lower portion of the recess, forming the barrier layer on the gate dielectric layer, and subjecting the exposed inner surface of the barrier layer to hydrogen processing, thereby rendering the exposed inner surface of the barrier layer selective to deposition of the gate metal with respect to the exposed inner surfaces of the spacers. The exemplary method may further include removing a portion of the barrier layer and the gate dielectric layer to expose the inner surfaces of the spacers adjoining the upper portion of the recess. The work function material is selected from the group consisting of titanium nitride and tantalum nitride in some embodiments. The gate metal consists essentially of one of ruthenium (Ru), rhodium (Rh), osmium (Os), iridium (Ir), molybdenum (Mo), tungsten (W) and cobalt (Co) in some embodiments, the gate metal being selectively deposited via chemical vapor deposition. In some embodiments, the gate metal consists essentially of cobalt. The channel region comprises a portion of a semiconductor fin 22 in one or more embodiments. The fin consists essentially of crystalline silicon in some embodiments and silicon germanium in other embodiments. The method is compatible with the formation of both n-type and p-type electronic devices such as FinFETs on the same substrate.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having FET devices formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method comprising:
   obtaining a structure including a channel region comprising semiconductor material, spacers adjoining the channel region, a recess having an upper portion and a lower portion above the channel region and bounded by the spacers, a gate dielectric layer within the recess and adjoining the channel region, and a barrier layer on the gate dielectric layer, the barrier layer having an exposed inner surface comprising a work function material within the lower portion of the recess, the spacers having exposed inner surfaces adjoining the upper portion of the recess above the exposed inner surface of the barrier layer, the exposed inner surface of the barrier layer being selective to deposition of a gate metal with respect to the exposed inner surfaces of the spacers;
   selectively depositing the gate metal on the exposed inner surface of the barrier layer, thereby forming a gate metal layer only within the lower portion of the recess, and forming a dielectric cap over the gate metal and within the upper portion of the recess.

2. The method of claim 1, wherein obtaining the structure further includes:
forming a sacrificial gate on the channel region;
forming the spacers on the sacrificial gate;
removing the sacrificial gate, thereby forming the recess bounded by the spacers;
forming the gate dielectric layer on the channel region and within the lower portion of the recess;
forming the barrier layer on the gate dielectric layer, and
exposing the structure to hydrogen under process conditions sufficient to render the exposed inner surface of the barrier layer selective to deposition of the gate metal with respect to the exposed inner surfaces of the spacers.

3. The method of claim 2, wherein obtaining the structure further includes removing a portion of the barrier layer and the gate dielectric layer to expose the inner surfaces of the spacers adjoining the upper portion of the recess.

4. The method of claim 3, wherein the work function material is selected from the group consisting of titanium nitride and tantalum nitride.

5. The method of claim 4, wherein the gate metal consists essentially of cobalt.

6. The method of claim 5, wherein the channel region comprises a portion of a semiconductor fin.

7. The method of claim 1, wherein the channel region comprises a portion of a semiconductor fin.

8. The method of claim 7, wherein the gate metal consists essentially of one of ruthenium (Ru), rhodium (Rh), osmium (Os), iridium (Ir), molybdenum (Mo), tungsten (W) and cobalt (Co), further including selectively depositing the gate metal via chemical vapor deposition.

9. The method of claim 8, wherein obtaining the structure further includes:
forming a sacrificial gate on the channel region;
forming the spacers on the sacrificial gate;
removing the sacrificial gate, thereby forming the recess bounded by the spacers;
forming the gate dielectric layer on the channel region and within the lower portion of the recess;
forming the barrier layer on the gate dielectric layer, and
exposing the structure to hydrogen under process conditions sufficient to render the exposed inner surface of the barrier layer selective to deposition of the gate metal with respect to the exposed inner surfaces of the spacers.

10. The method of claim 9, wherein the semiconductor fin consists essentially of silicon or silicon germanium.

11. The method of claim 10, wherein the barrier layer comprises titanium nitride.

12. The method of claim 11, wherein forming the barrier layer on the gate dielectric layer includes depositing the barrier layer as a conformal layer on the structure and recessing the barrier layer down to the lower portion of the recess.

13. The method of claim 9, wherein the process conditions include pressure between 0.5-10 torr, temperature between 200-400° C., and hydrogen flow rate between 1-12 slm.

14. The method of claim 9, further including discontinuing selectively depositing the gate metal after a selected time has elapsed, and forming the dielectric cap on the gate metal without etching the gate metal prior to forming the dielectric cap.

15. The method of claim 1 wherein forming the dielectric cap within the upper portion of the recess is performed without prior chemical mechanical planarization of the gate metal.

16. The method of claim 2 wherein forming the dielectric cap within the upper portion of the recess is performed without prior chemical mechanical planarization of the gate metal.

* * * * *